US006657307B2

(12) United States Patent
Iwamoto

(10) Patent No.: US 6,657,307 B2
(45) Date of Patent: Dec. 2, 2003

(54) SEMICONDUCTOR INTEGRATED CIRCUIT HAVING FUNCTIONAL MACRO WITH IMPROVED POWER LINE CONNECTION STRUCTURE

(75) Inventor: Minoru Iwamoto, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 09/864,445

(22) Filed: May 25, 2001

(65) Prior Publication Data

US 2001/0045622 A1 Nov. 29, 2001

(30) Foreign Application Priority Data

May 29, 2000 (JP) ........................................ 2000-157932

(51) Int. Cl.[7] .............................................. H01L 23/48
(52) U.S. Cl. ...................... 257/773; 257/776; 257/210; 257/691; 257/208
(58) Field of Search ................................. 257/773, 776, 257/691, 210, 208, 207, 211, 774, 506

(56) References Cited

U.S. PATENT DOCUMENTS 4,989,062 A * 1/1991 Takahashi et al. .......... 257/207
5,095,352 A * 3/1992 Noda et al. ................. 257/202
5,850,091 A * 12/1998 Li et al. ..................... 257/315
6,269,466 B1 * 7/2001 Crafts ............................ 716/1
6,326,693 B1 * 12/2001 Mimoto et al. ............. 257/208

FOREIGN PATENT DOCUMENTS

| JP | 2180050 | 7/1990 |
| JP | 4033367 | 2/1992 |
| JP | 4302161 | 10/1992 |
| JP | 5083189 | 4/1993 |
| JP | 6291256 | 10/1994 |

* cited by examiner

Primary Examiner—David L. Talbott
Assistant Examiner—Luan Thai
(74) Attorney, Agent, or Firm—Young & Thompson

(57) ABSTRACT

In a semiconductor integrated circuit having a functional macro, plural first and second power lines extending over the functional macro and supplying first-level and second-level voltages respectively to the functional macro are electrically connected through plural first and second power terminal patterns to plural third and fourth power lines extending over the semiconductor integrated circuit in the second direction and supplying the first-level and second-level voltages respectively to the semiconductor integrated circuit.

19 Claims, 16 Drawing Sheets

SEMICONDUCTOR INTEGRATED CIRCUIT HAVING FUNCTIONAL MACRO WITH IMPROVED POWER LINE CONNECTION STRUCTURE

BACKGROUND OF THE INVENTION

1. Field of the Invention

The present invention relates to a semiconductor device, and more particularly to a semiconductor integrated circuit having a functional macro with an improved power line connection structure.

2. Description of the Related Art

FIG. 1 is a schematic view of a structure of a memory macro that is an example of a functional macro. A functional macro 1 comprises an address decode block 10, a memory cell block 11, an address block 12 and a data input/output block 13. The blocks 10, 11, 12 and 13 are optimized so as to minimize the area of the functional macro 1.

FIG. 2 is a schematic view of layout of power supply lines of functional macro 1. Power supply lines 2 are provided in random over the functional macro 1. The power supply lines 2 typically are third level interconnections. First and second level interconnections are not illustrated in FIG. 2.

FIG. 3 is a plan view of a semiconductor integrated circuit that includes the functional macro of FIG. 1. The functional macro 1 is placed on a region of a semiconductor integrated circuit 4, that has a regular alignment of power source lines 5, which may be fifth level interconnections.

FIG. 4 is a fragmentary enlarged plan view of a region "A" defined by a broken line in FIG. 3. The power lines 5 of the semiconductor integrated circuit 4 have a different alignment from the power lines 2 of the functional macro 1. When the functional macro 1 is placed on the semiconductor integrated circuit 4, the power lines 5 of the semiconductor integrated circuit 4 may partially overlap the power lines 2 of the functional macro 1. Only the overlapping power lines 5 are electrically connected to the power lines 2. In FIG. 4, the overlapping power line 5 is marked by a broken line region "B". This alignment scheme makes it difficult to supply sufficient power to the functional macro 1.

FIG. 5 is a fragmentary enlarged plan view of a center region "A" of another semiconductor integrated circuit. Adjacent power lines 2 and 5 are electrically connected to each other through additional power lines 6. The width of each of the additional power lines 6 is determined in consideration of an allowable low voltage. Variation of placement conditions causes variation of connection conditions. It is necessary for designers to calculate separately the width of each additional power line 6 since the placement conditions vary. This additional design work is inconvenient and undesirable.

FIG. 6 is a fragmentary enlarged plan view of a center region "A" of still another semiconductor integrated circuit. The power lines 2 of the functional macro 2 are aligned with the power lines 5 of the semiconductor integrated circuit 4. Thus, the alignment of the power lines 2 is based on the alignment of the power lines 5. This increases the area of the functional macro 1.

In the above circumstances, the development of a novel semiconductor integrated circuit having a functional macro free from the above problems is desirable.

SUMMARY OF THE INVENTION

It is an object of the present invention to provide a novel semiconductor integrated circuit (IC) having a functional macro that is connected to the power lines for the IC in a manner that avoid the problems of the prior art.

It is a further object of the invention to provide a novel IC having a functional macro that is connected to the power lines for the IC with a structure that includes power terminal patterns on a level between the levels of the power lines for the IC and the power lines for the function macro where each of the power terminal patterns extends between a first area corresponding to an adjacent pair of the macro power lines and a second area corresponding to an adjacent pair of the IC power lines.

It is a another object of the invention to provide a novel IC having a functional macro that is connected to the power lines for the IC with a structure that includes power terminal patterns on a level between the levels of the power lines for the IC and the power lines for the function macro where each of the power terminal patterns has the same size and shape.

It is yet another object of the invention to provide a novel IC having a functional macro that is connected to the power lines for the IC with a structure that includes power terminal patterns on a level between the levels of the power lines for the IC and the power lines for the function macro where the power terminal patterns includes a repeating pattern of similar shapes that are spaced the same distance from each other.

These objects and other objects, features, and advantages of the present invention will be apparent from the following description of preferred embodiments.

BRIEF DESCRIPTION OF THE DRAWINGS

Preferred embodiments according to the present invention will be described in detail with reference to the accompanying drawings.

DETAILED DESCRIPTION OF PREFERRED EMBODIMENTS

The present invention provides a power line connection structure for connecting a semiconductor integrated circuit (IC) to a functional macro. As may be seen in FIGS. 7–15, first power lines 2V on a first level provide a first voltage to the functional macro and second power lines 2G on the first level provide a second voltage, different than the first voltage, to the functional macro. The first and second power lines may be parallel to each other. Third power lines 5G on a second level, different than the first level, provide the first voltage to the IC and fourth power lines 5V on the second level provide the second voltage to the IC. The third and fourth power lines may be parallel to each other, and also to the first and second power lines.

Power terminal patterns 31V and 31G, 32G and 32V, and 33G and 33V are on a third level between the first and second levels. Each of the plural power terminal patterns extends on the third level between a first area corresponding to an adjacent pair of the first and second power lines 2V and 2G and a second area corresponding to an adjacent pair of the third and fourth lines 5V and 5G. A first set of the plural power terminal patterns 31V, 32V, and 33V is connected to the first and third power lines 2V and 5V and a second set of the plural power terminal patterns 31G, 32G, and 33G, which does not include any of the first set, is connected to the second and fourth power lines 2G and 5G.

Figure 1:
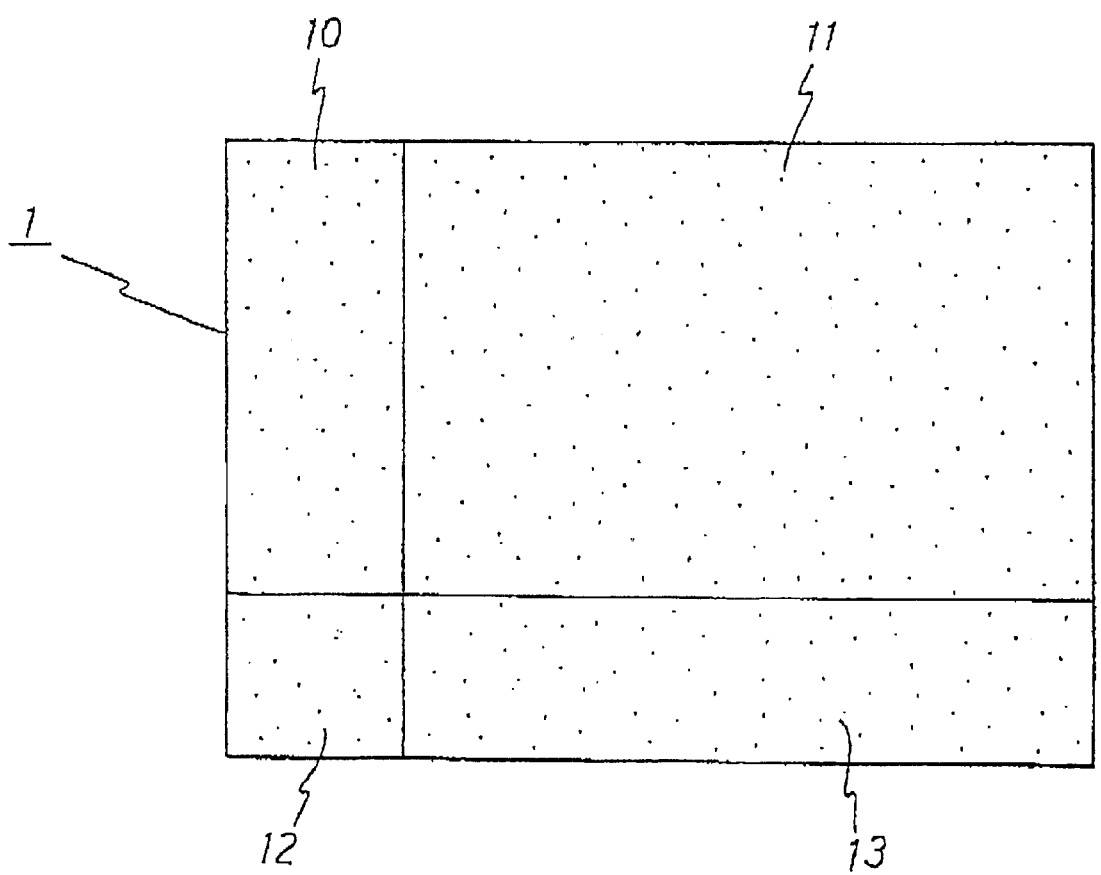
FIG. 1 is a schematic view of a structure of a memory macro that is an example of a functional macro.
Figure 2:
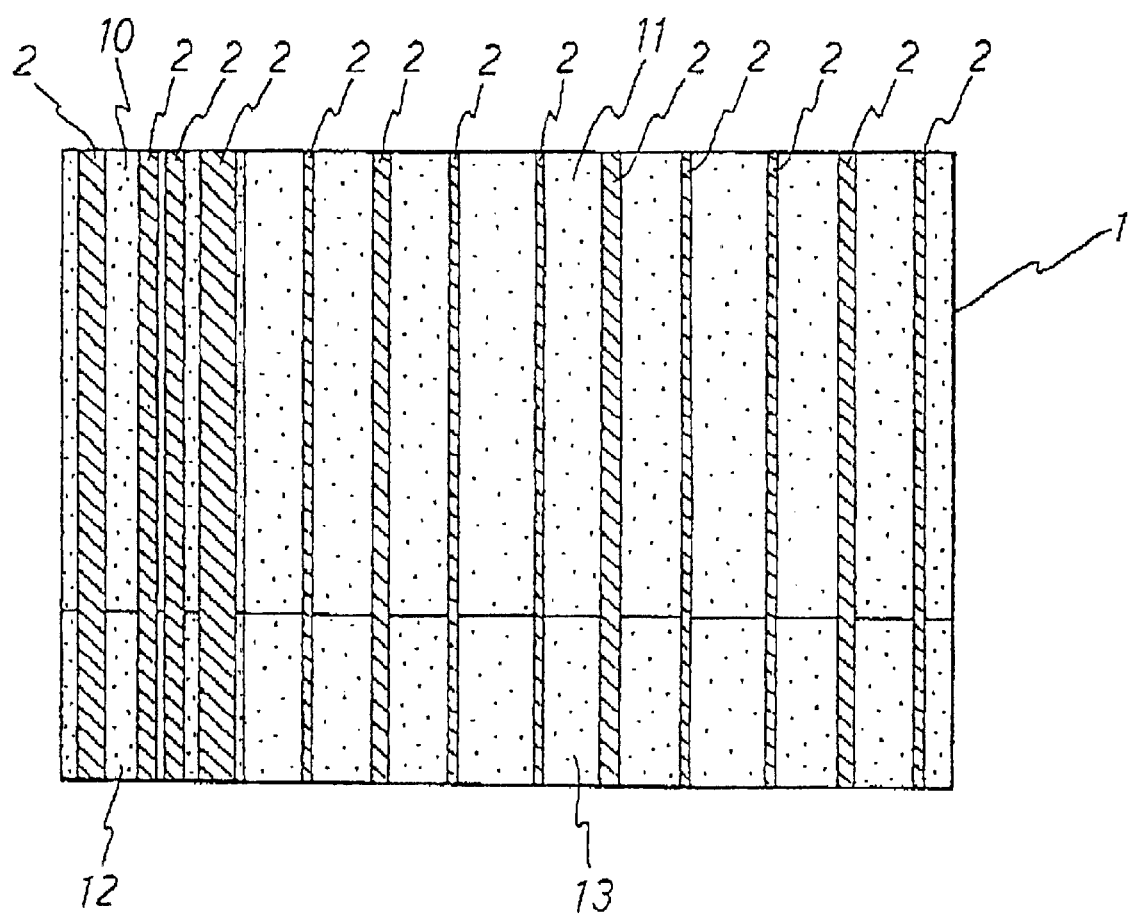
FIG. 2 is a schematic view of a layout of power supply lines of the memory macro of FIG. 1.
Figure 3:
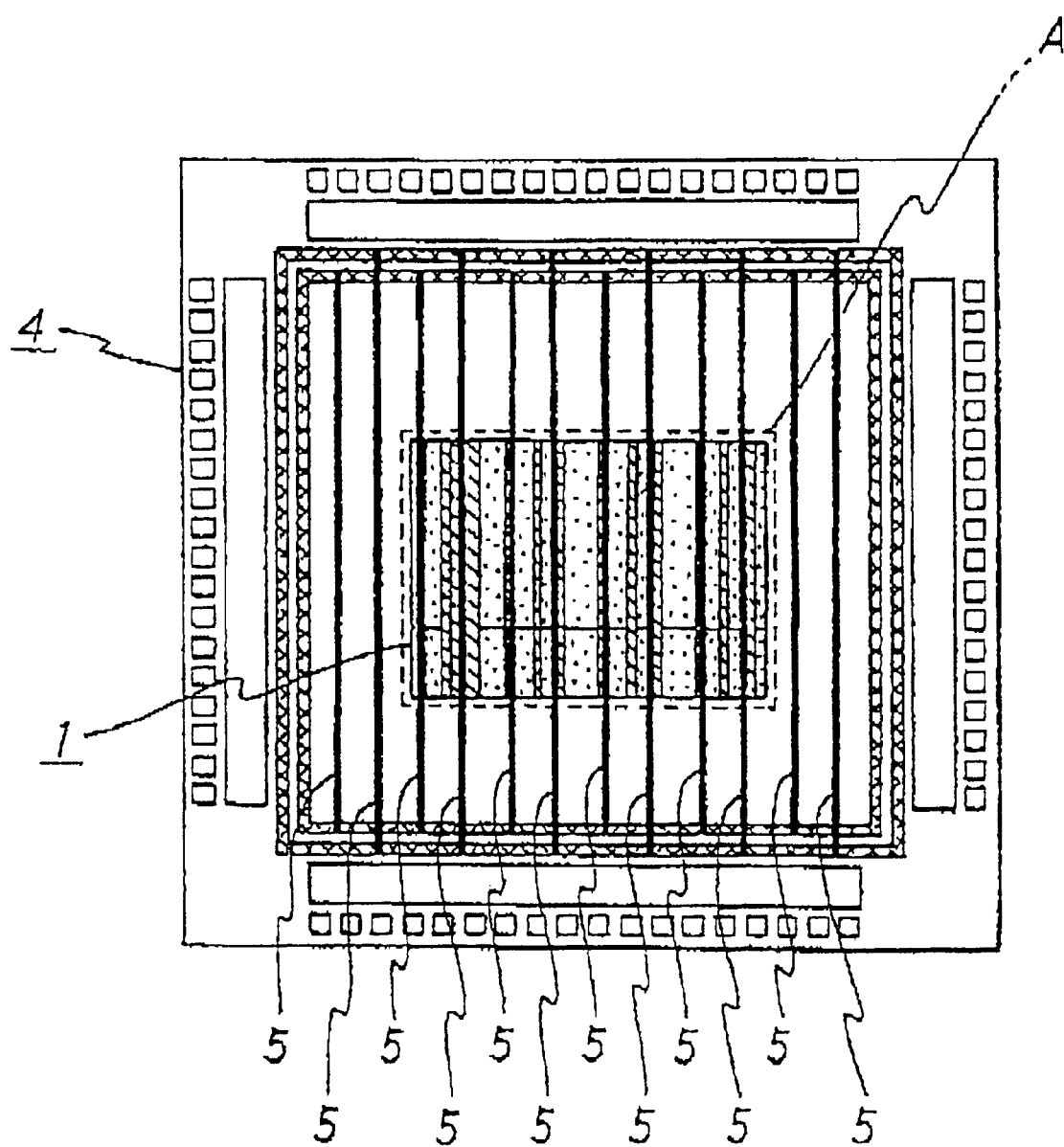
FIG. 3 is a plan view of a semiconductor integrated circuit having the functional macro of FIG. 1.
Figure 4:
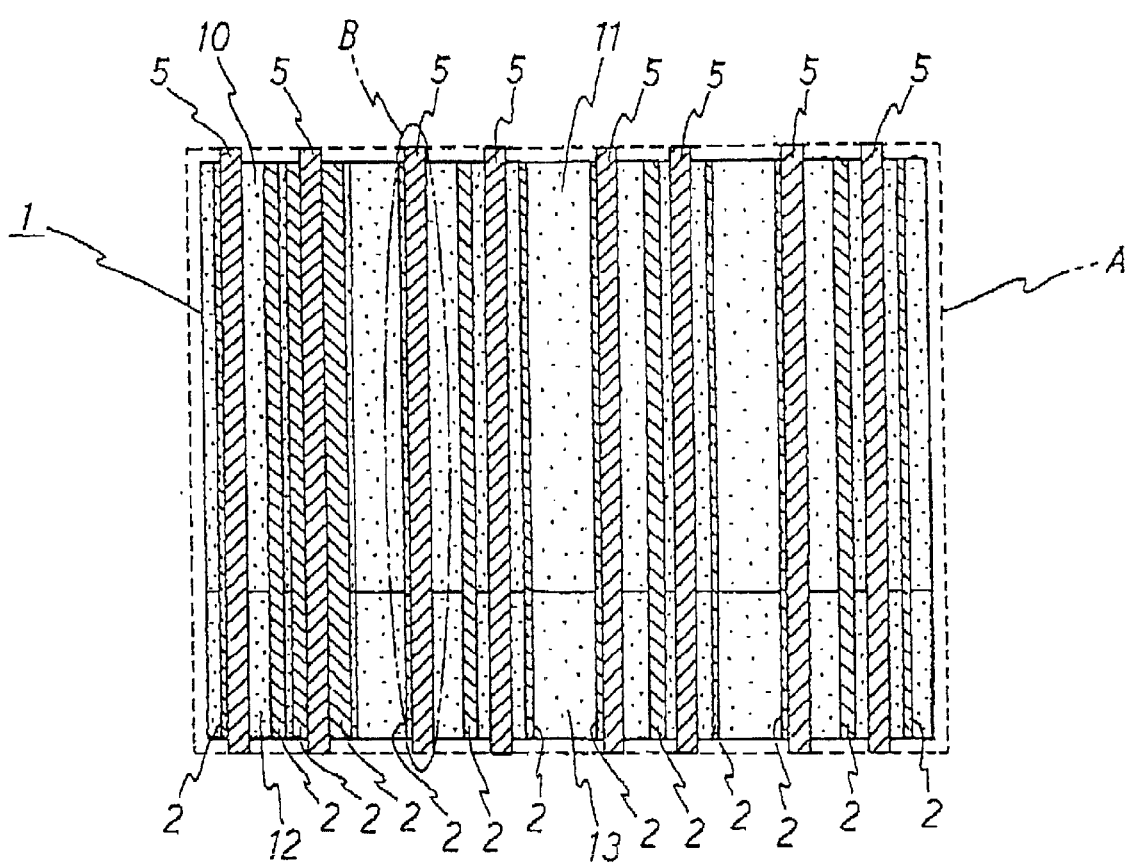
FIG. 4 is a fragmentary enlarged plan view of a center region "A" of the semiconductor integrated circuit of FIG. 3.
Figure 5:
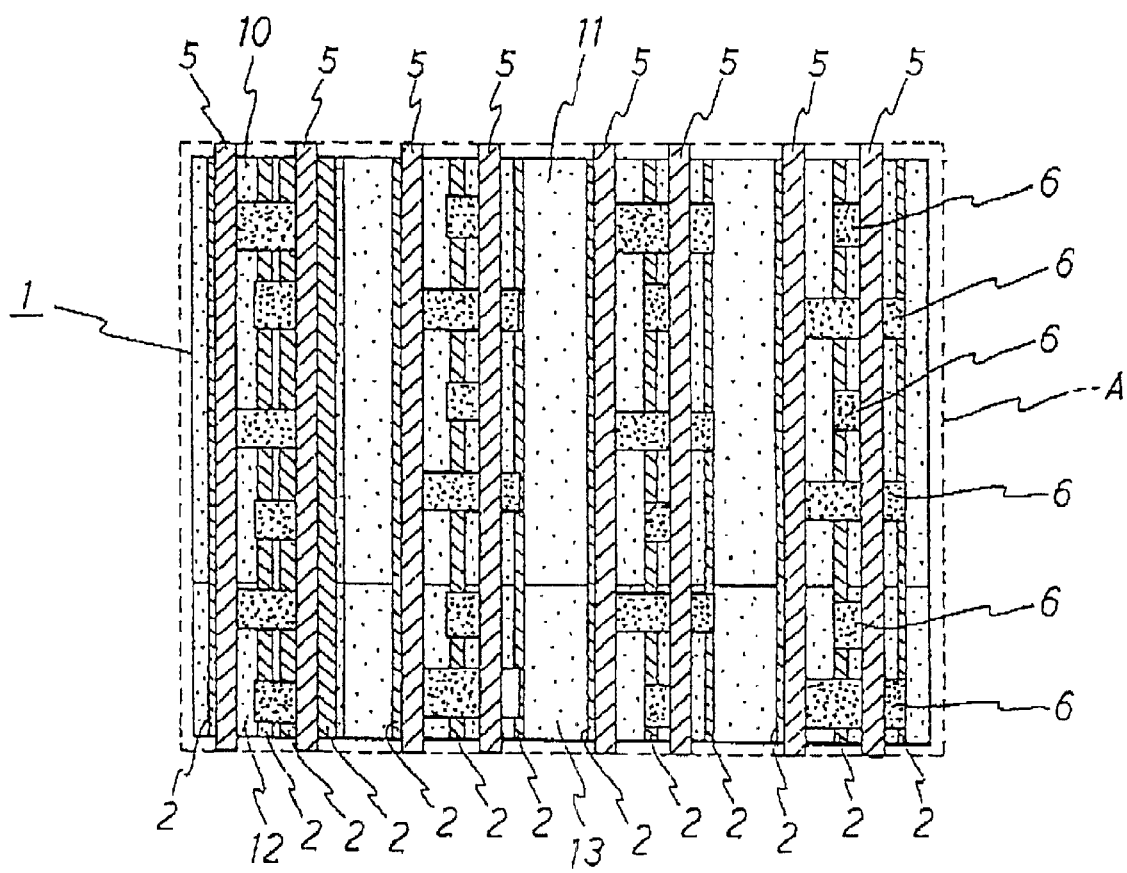
FIG. 5 is a fragmentary enlarged plan view of a center region "A" of another semiconductor integrated circuit.
Figure 6:
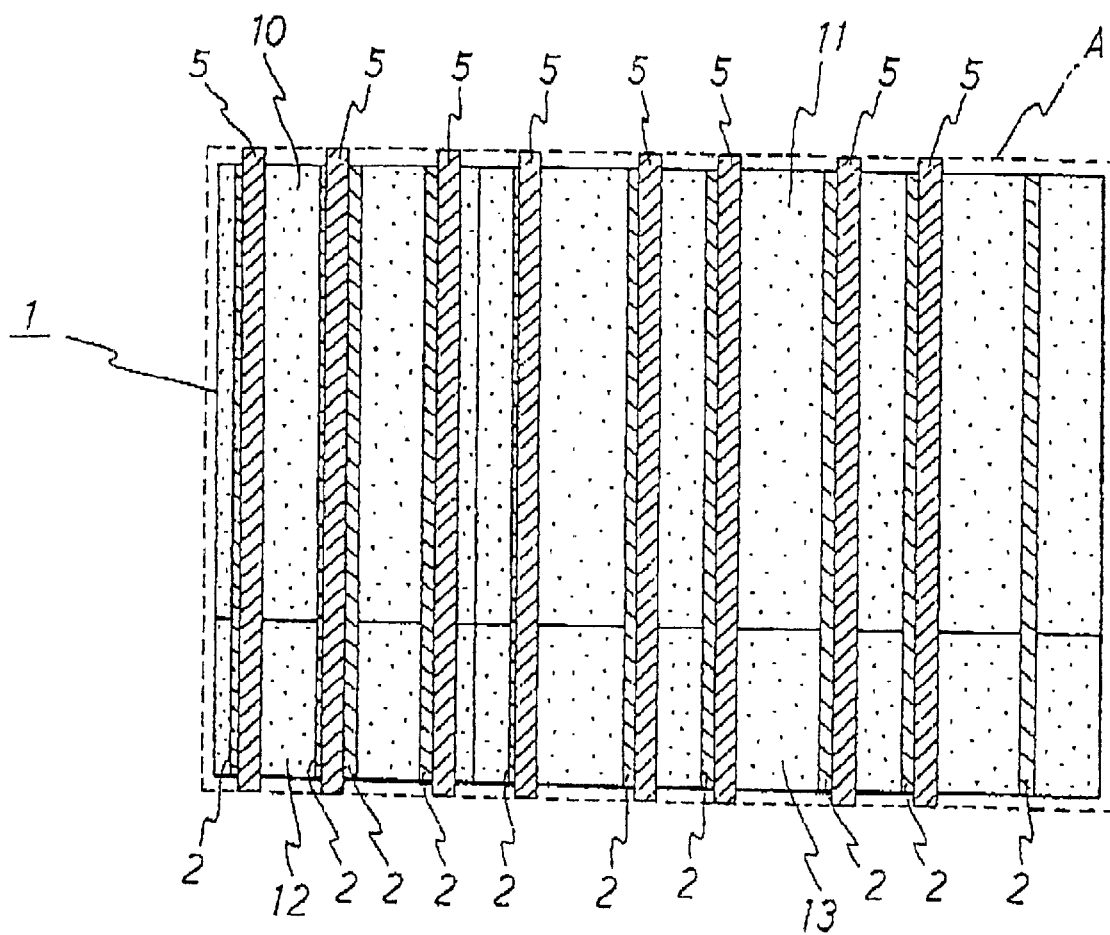
FIG. 6 is a fragmentary enlarged plan view of a center region "A" of still another semiconductor integrated circuit.
Figure 7:
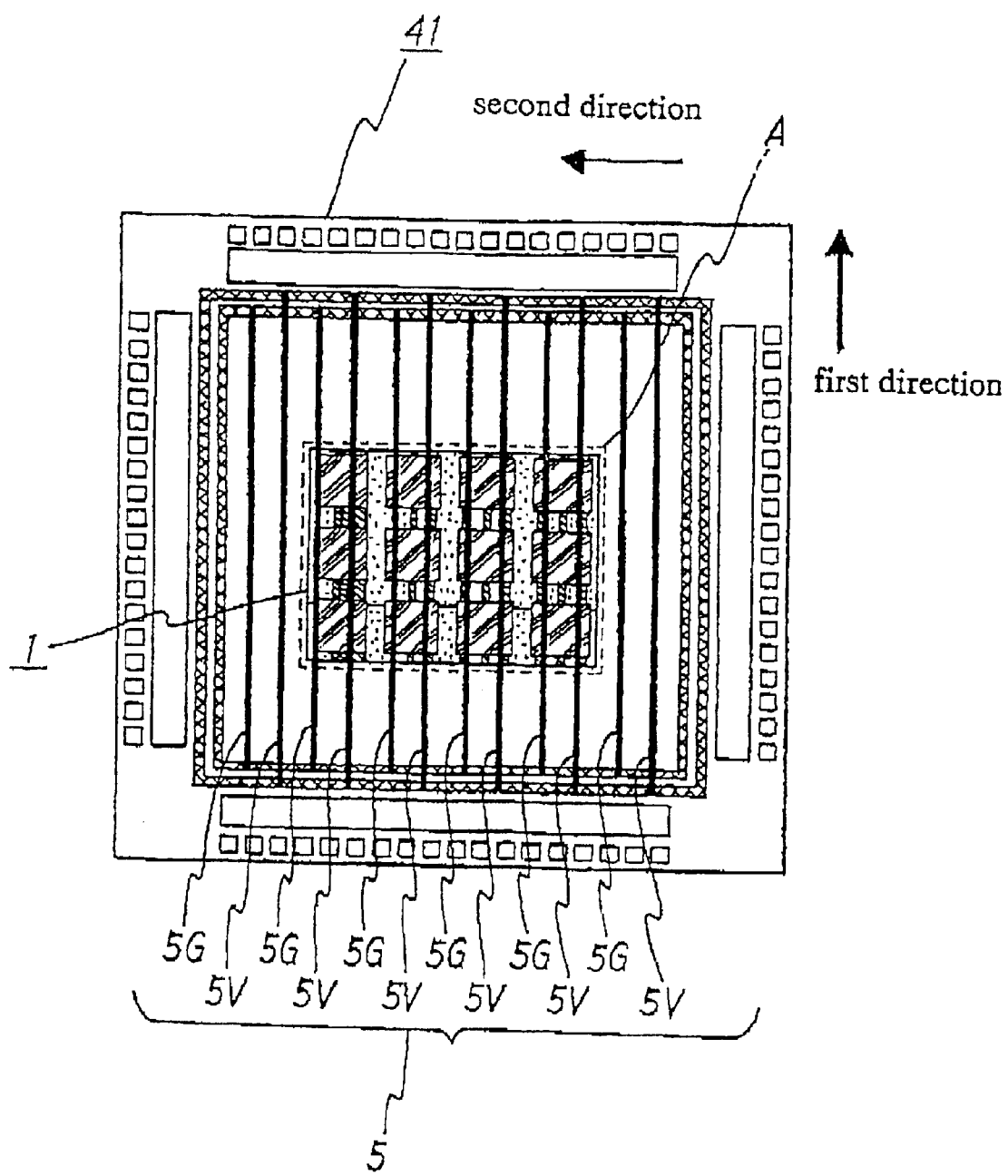
FIG. 7 is a plan view of a semiconductor integrated circuit having a functional macro in a first embodiment in accordance with the present invention.
Figure 8:
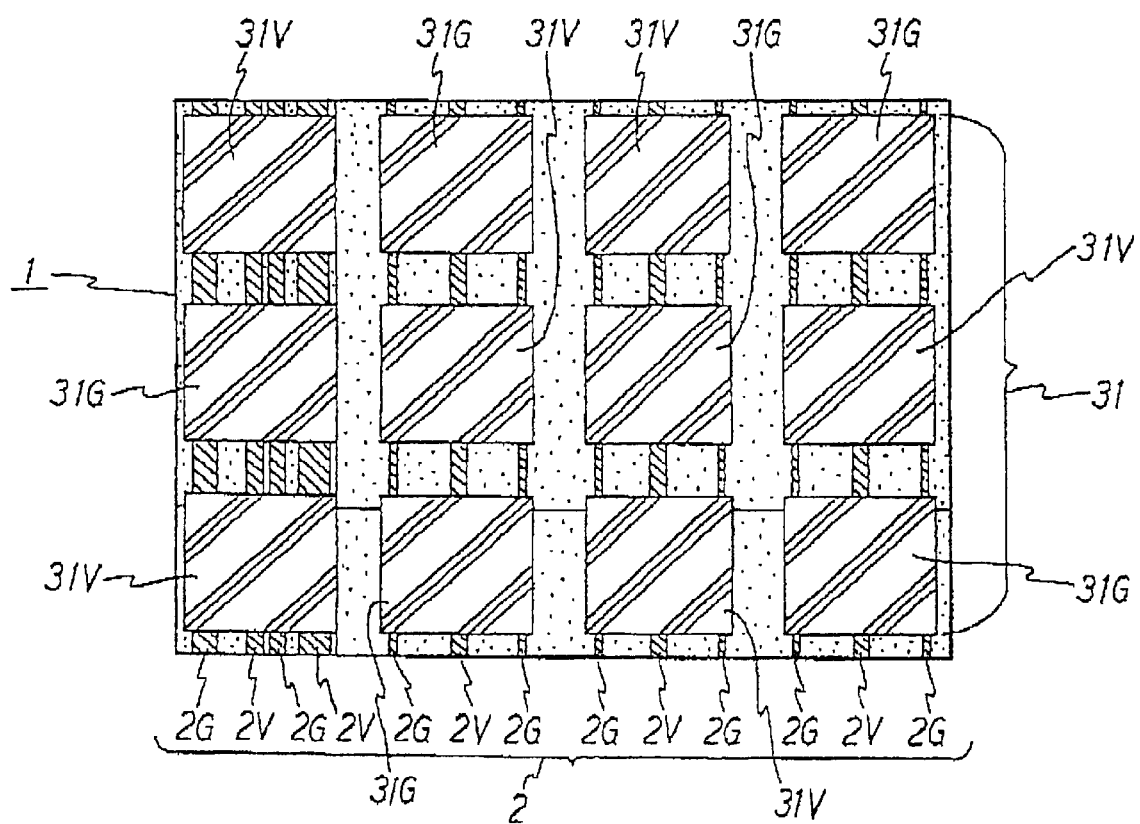
FIG. 8 is a plan view of the functional macro shown in FIG. 7A.
Figure 11:
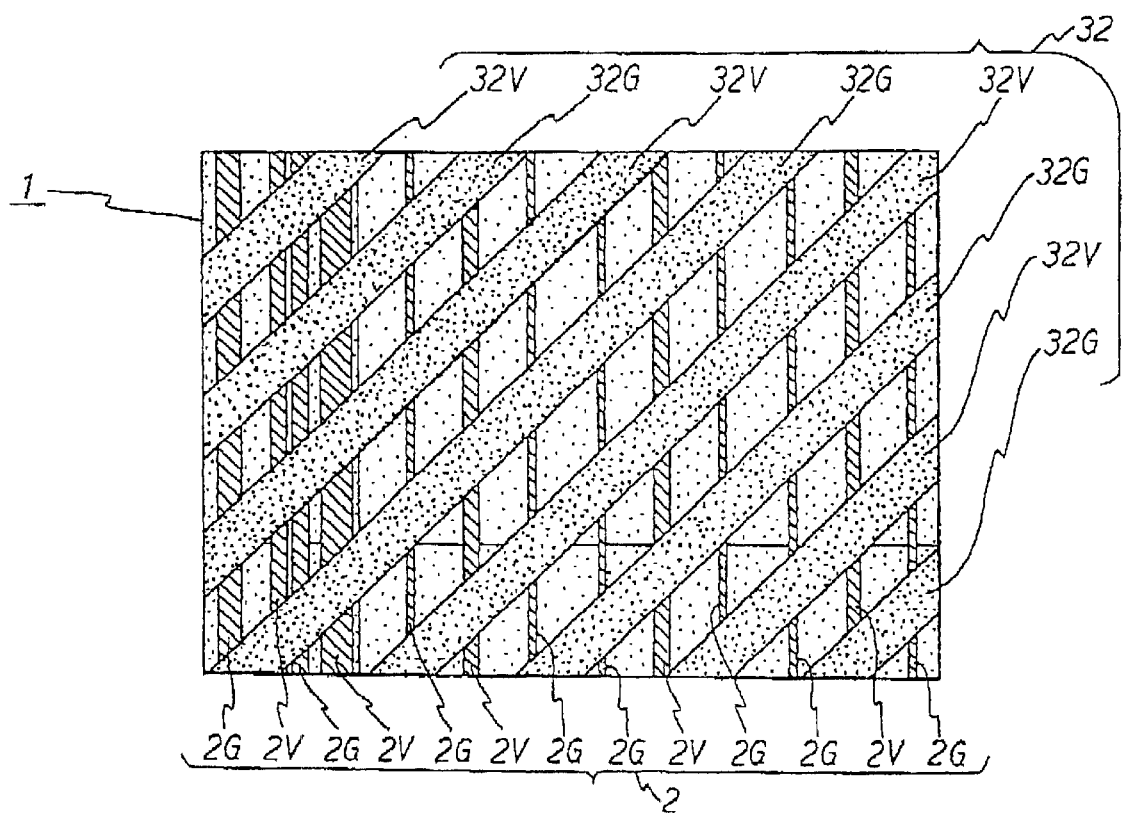
FIG. 11 is a plan view of the functional macro shown in FIG. 10.
Figure 14:
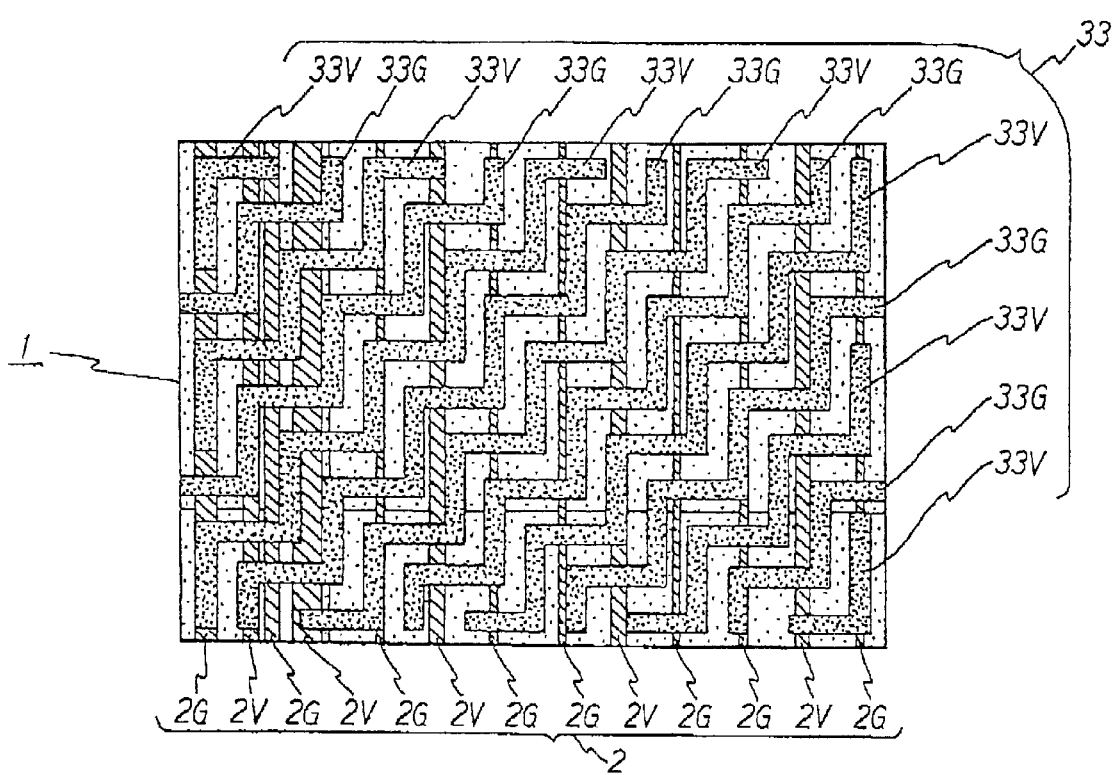
FIG. 14 is a plan view of the functional macro shown in FIG. 13.

Each of the power terminal patterns 31V and 31G, 32G and 32V, and 33G and 33V may have the same size and shape, such as shown in FIGS. 8, 11 and 14, or the power terminal patterns may include a repeating pattern of similar shapes that are spaced at the same distance from each other, such as shown in FIGS. 8, 11, and 14. Of course, other shapes consistent with the definitions in the claims may be used.

The present invention introduces uniformity into the structure for connecting the power lines, thereby avoiding the need for designers to calculate separately the size of each connection.

A first embodiment according to the present invention will be described in detail with reference to FIGS. 7–8 and 9A and 9B. A semiconductor integrated circuit 41 includes a functional macro 1 that extends on a region "A" of the semiconductor integrated circuit 41. The functional macro 1 has a parallel alignment of first power lines 2 for supplying power to the functional macro 1. The first power lines 2 extend in a first direction over a top surface of the functional macro 1. The first power lines 2 extend in a first level insulating film 11. The first power lines 2 may be classified into high voltage power lines 2V for supplying a high voltage and low voltage power lines 2G for supplying a low voltage. The low voltage may, for example, be a ground voltage. In this case, the high voltage is a positive voltage level higher than the ground voltage level.

The functional macro 1 also has a matrix array of power terminal patterns 31, which are provided over a top surface of the first level insulating film 11. The power terminal patterns 31 extend in a second level insulating film 12 which overlays the first level insulating film 11. The power terminal patterns 31 may have uniform island patterns having the same size and shape, for example, a square or a rectangle as illustrated. The power terminal patterns 31 are aligned at a first constant pitch in the first direction along which the first power lines 2 extend. The power terminal patterns 31 are aligned at a second constant pitch in the second direction.

Each rectangle shape of the power terminal patterns 31 has a size in the second direction that extends, in the second direction, over at least a plurality of the first power lines 2, which comprise at least one high voltage power line 2V and at least one low voltage power line 2G. For example, as shown in FIG. 8, some of the power terminal patterns 31 extend over a single high voltage power line 2V and two low voltage power lines 2G, and others extend over two high voltage power lines 2V and two low voltage power lines 2G.

The power terminal patterns 31 may also be classified into high voltage power terminal patterns 31V having the high voltage, and low voltage power terminal patterns 31G having the low voltage. The high and low voltage power terminal patterns 31V and 31G are alternately aligned in each of the first and second directions. Four sides of each of the high voltage power terminal patterns 31V are adjacent to but separated from the four of the low voltage power terminal patterns 31G. Four sides of each of the low voltage power terminal patterns 31G are adjacent to but separated from the four of the high voltage power terminal patterns 31V.

The above matrix array, therefore, comprises first-directional and second-directional alignments of the alternating high and low voltage power terminal patterns 31V and 31G, and further plural diagonal alignments of the high voltage power terminal patterns 31V and alternating plural diagonal alignments of the low voltage power terminal patterns 31G. Namely, the above matrix array forms a checkered pattern of the high and low voltage power terminal patterns 31V and 31G.

The high voltage power terminal patterns 31V are electrically connected to the high voltage power lines 2V through a first set of first level contact plugs 14 which are formed in contact holes in the above first level insulating film 11. The low voltage power terminal patterns 31G are also electrically connected to the low voltage power lines 2G through a second set of the first level contact plugs 14, wherein the second set of the first level contact plugs does not include any of the first set of the first level contact plugs.

The semiconductor integrated circuit 41 has a parallel alignment of second power lines 5 for supplying power to the semiconductor integrated circuit 41. The parallel alignment of the second power lines 5 is different in pitch from the parallel alignment of the first power lines 2. The second power lines 5 extend in the first lateral direction. The second power lines 5 extend over the second level insulating film 12 and in a third level insulating film 13 which overlays the second level insulating film 12. The second power lines 5 may be classified into high voltage supply lines 5V for supplying the high voltage and low voltage supply lines 5G for supplying the low voltage.

Figure 9A:
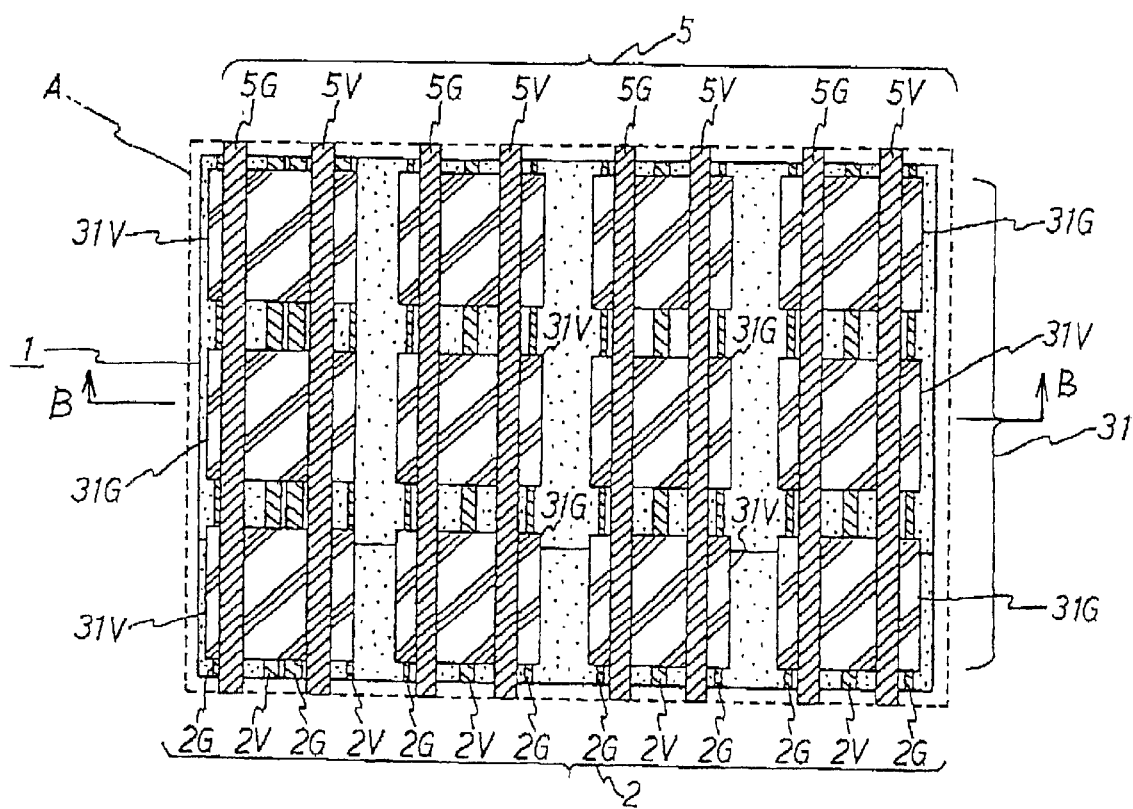
FIG. 9A is a fragmentary enlarged plan view of the semiconductor integrated circuit on a center region "A" shown in FIG. 7.
Figure 9B:
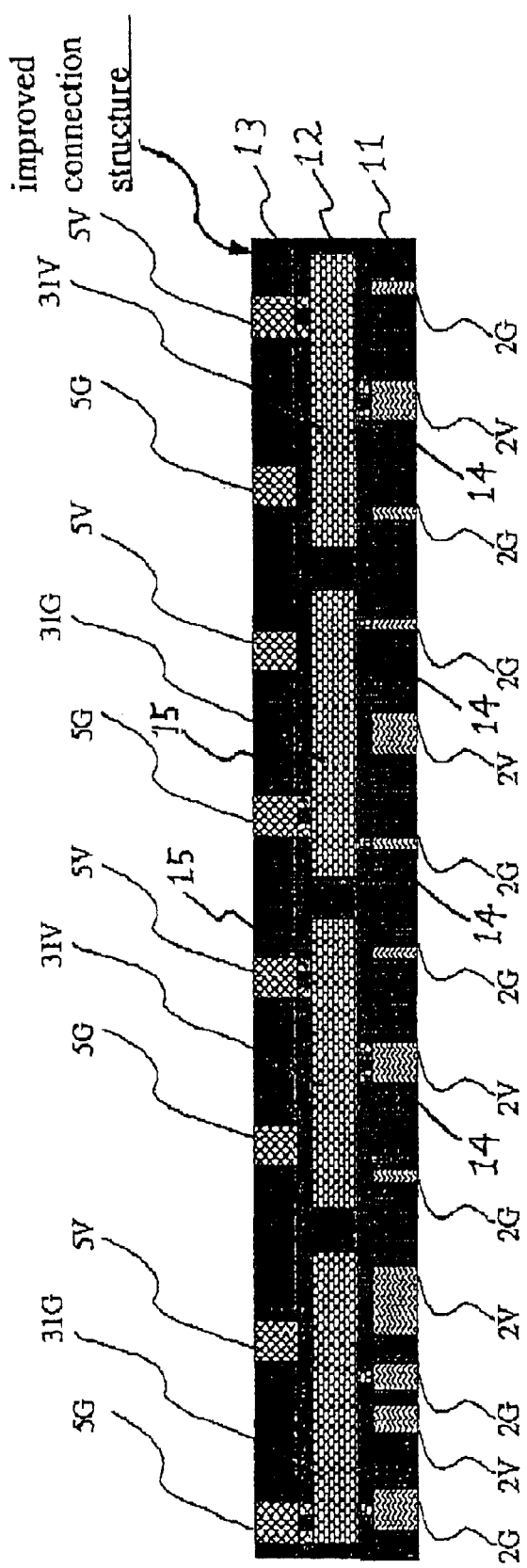
FIG. 9B is a cross sectional elevation view of the semiconductor integrated circuit, taken along a B—B line in FIG. 9A.

The high and low voltage supply lines 5V and 5G are alternately aligned in the second direction at a constant pitch which is larger than the pitch of the first power lines 2 of the functional macro 1. The size in the second direction of each rectangle of the power terminal patterns 31 is larger than the constant pitch of the alternating alignment of the high and low voltage supply lines 5V and 5G, so that each power terminal pattern 31 extends, in the second direction, under at least a plurality of the second power lines 5, which comprise at least one high voltage power line 5V and at least one low voltage power line 5G. For example, as shown in FIGS. 9A and 9B, each power terminal pattern 31 extends under a pair of adjacent high and low voltage power lines 5V and 5G. Thus, all of the high and low voltage power lines 5V and 5G overlay the power terminal patterns 31.

The size in the second direction of each rectangle of the power terminal patterns 31 is also larger than the pitch of the alignment of the high and low voltage supply lines 2V and 2G, so that each power terminal pattern 31 extends, in the second direction, over at least a plurality of the first power lines 2, which comprise at least one high voltage power line 2V and at least one low voltage power line 2G. For example, as shown in FIGS. 9A and 9B, each power terminal pattern 31 extends over a pair of adjacent high and low voltage power lines 2V and 2G. Thus, all of the high and low voltage power lines 2V and 2G underlay the power terminal patterns 31.

The high voltage power terminal patterns 31V are further electrically connected to the high voltage power lines 5V through a first set of second level contact plugs 15 which are formed in contact holes in the second level insulating film 12. The high voltage power lines 5V of the semiconductor integrated circuit 41 are electrically connected through the high voltage power terminal patterns 31V to the high voltage power lines 2V of the functional macro 1.

The low voltage power terminal patterns 31G are also electrically connected to the low voltage power lines 5G through a second set of the second level contact plugs which are formed in other contact holes in the second level insulating film 12, wherein the second set of the second level contact plugs does not include any of the first set of the second level contact plugs. The low voltage power lines 5G of the semiconductor integrated circuit 41 are electrically connected through the low voltage power terminal patterns 31G to the low voltage power lines 2G of the functional macro 1.

In a typical semiconductor device, the first power lines 2 of the functional macro 1 may actually comprise a third level metal layer, the power terminal patterns 31 of the functional macro 1 may comprise a fourth level metal layer, and the second power lines 5 of the semiconductor integrated circuit 41 may comprise a fifth level metal layer.

As is clear from FIG. 9B, the size in the second direction of each rectangle of the power terminal patterns 31 is larger than the constant pitch of the alternating alignment of the high and low voltage supply lines 5V and 5G, so that each power terminal pattern 31 extends under a pair of adjacent high and low voltage power lines 5V and 5G independent of any displacement of the functional macro 1. Also, the size in the second direction of each rectangle of the power terminal patterns 31 is larger than the pitch of the alignment of the high and low voltage supply lines 2V and 2G, so that each power terminal pattern 31 extends over a pair of adjacent high and low voltage power lines 2V and 2G independent of any displacement of the functional macro 1.

Therefore, all of the second power lines 5 of the semiconductor integrated circuit 41 are electrically connected through the power terminal patterns 31 to all of the first power lines 2 of the functional macro 1, even if the functional macro 1 is displaced over the semiconductor integrated circuit 41. Namely, all of the second power lines 5 are electrically connected through the power terminal patterns 31 to all of the first power lines 2 without additional re-design work and any increase in the area of the functional macro 1.

A voltage drop "V" and a resistance "R" of the first power lines 2 of the functional macro 1 are given by the following equations.

$$V = I \times R [V] \quad (I: \text{current [A]; and R: resistance } [\Omega])$$

$$R = \rho_s \times L [\Omega] \quad (\rho_s: \text{resistivity } [\Omega/\mu m]; \text{ and L: current path length } [\mu m])$$

The current path length "L" is defined as a maximum distance between a contact plug connected to the first power line 2 and a contact plug connected to the second power line 5.

If, contrary to the present invention, the first and second power lines 2 and 5 are connected through contact plugs aligned at a pitch of 500 micrometers without the power terminal patterns 31 there between, then the current path length "L" is 250 micrometers, and the voltage drop "V" is $250 \times \rho_s \times I [V]$.

In accordance with the present invention, the first and second power lines 2 and 5 are connected through the power terminal patterns 31, which may be aligned at a pitch of 50 micrometers for example, then the current path length "L" is 50 micrometers. The reason why the current path length "L" is not 25 micrometers is that the high and low voltage power terminal patterns 31V and 31G are alternately aligned in the first direction. Namely, the high voltage power lines 2V and 5V are connected to each other through the high voltage power terminal patterns 31V, which may be aligned at a pitch of 100 micrometers for example. Also, the low voltage power lines 2G and 5G are connected to each other through the low voltage power terminal patterns 31G, which are aligned at a pitch of 100 micrometers for example. Since the current path length "L" is 50 micrometers, the voltage drop "V" is $50 \times \rho_s \times I [V]$. This voltage drop "V" is only one fifth of the above voltage drop given in the above case.

Accordingly, the power terminal patterns 31V, which connect the voltage power lines 2V and 5V, are distributed in matrix array over the functional macro. This structure reduces the voltage drop appearing on the first power lines 2.

Figure 10:
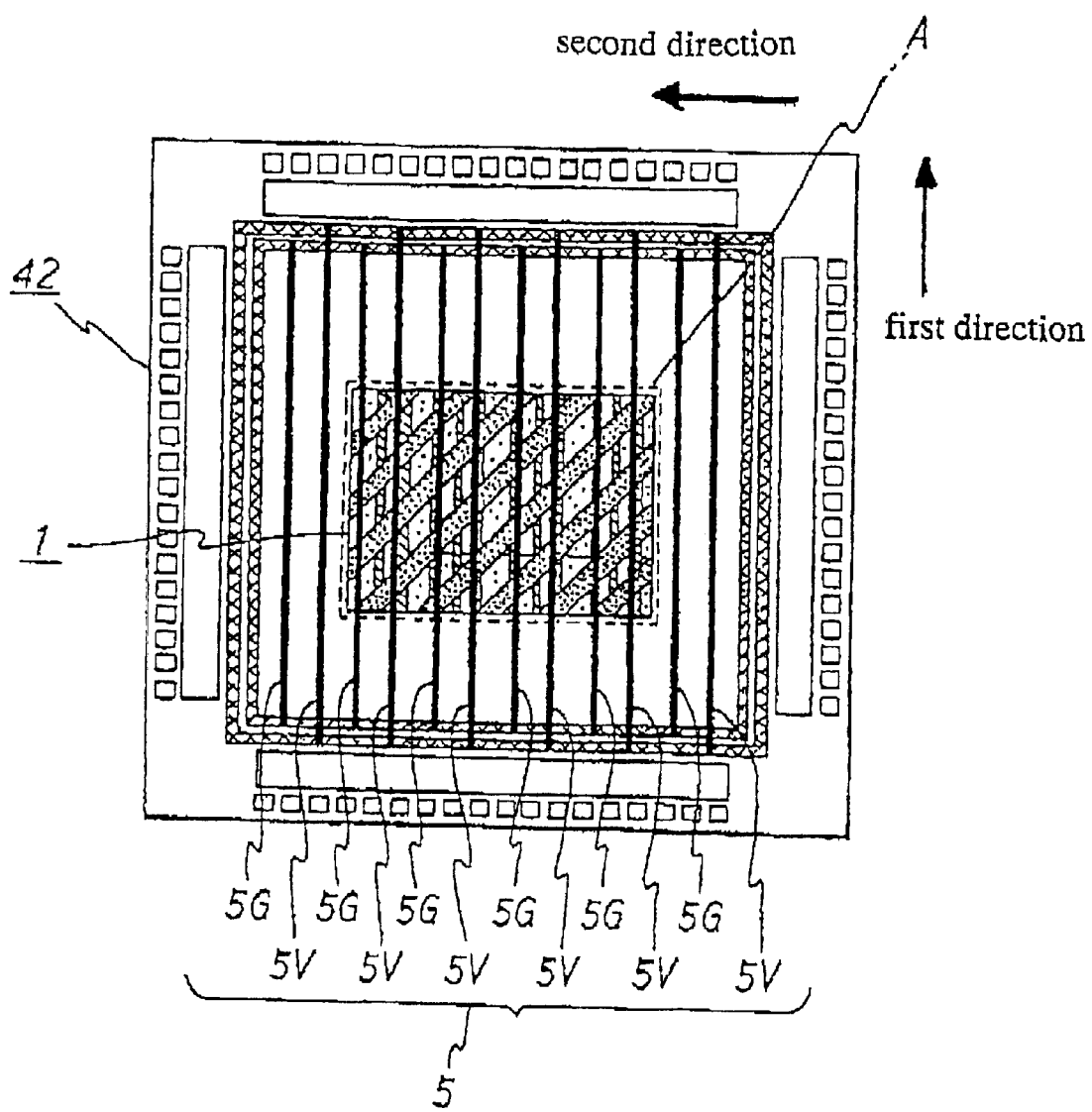
FIG. 10 is a plan view of a semiconductor integrated circuit having a functional macro in a second embodiment in accordance with the present invention.
Figure 12:
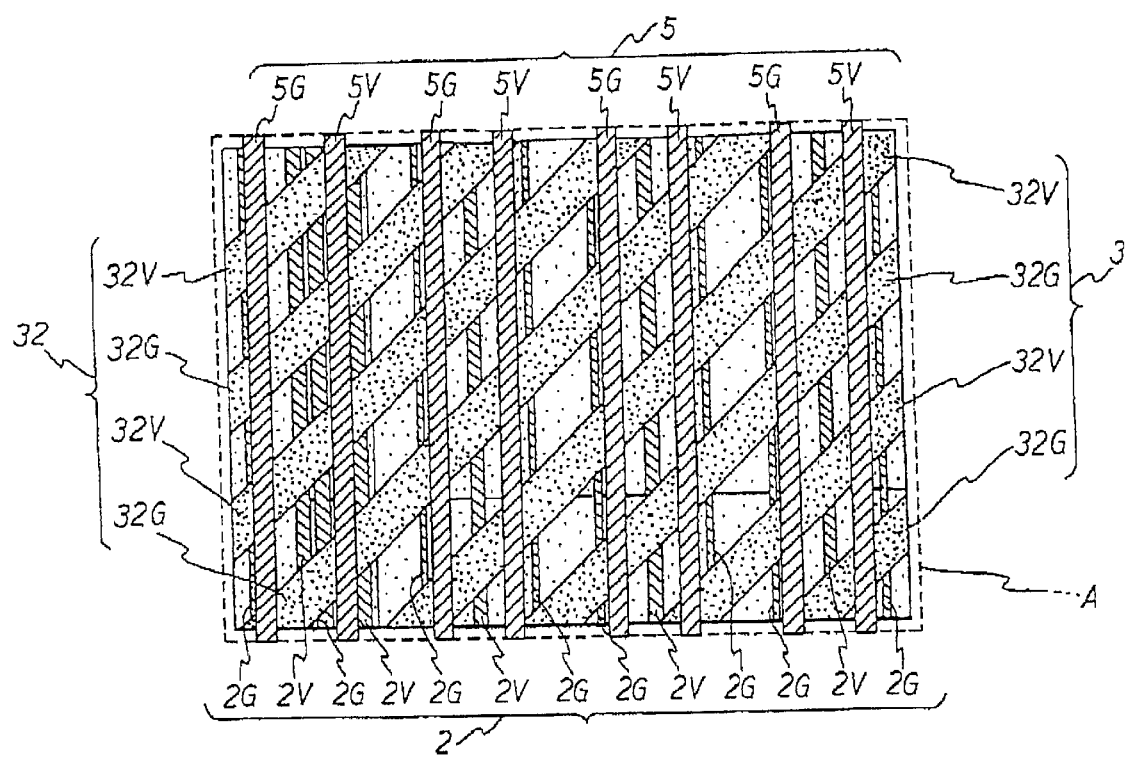
FIG. 12 is a fragmentary enlarged plan view of the semiconductor integrated circuit on a center region "A" shown in FIG. 10.

A second embodiment according to the present invention will be described in detail with reference to FIGS. 10–12. A semiconductor integrated circuit 42 has the same structure as that of the first embodiment, except for the following. The power terminal patterns 32, which are provided over a top surface of the first level insulating film, are aligned diagonally transverse functional macro power lines. The power terminal patterns 32 have a straight stripe shape with a uniform width and extend in a first diagonal direction, which is oblique to the first and second directions. Recall that the first and second power lines 2 and 5 extend in the first direction, and that the first and second power lines 2 and 5 are aligned in the second direction. The diagonal parallel alignment has a constant pitch which is different from the first pitch of the first power lines 2 and also from the second pitch of the second power lines 5.

The first diagonal direction of the straight stripe of the power terminal patterns 32 has such an oblique angle that at least a majority of the power terminal patterns 32 extends across at least a plurality of the first power lines 2, which comprise at least one high voltage power line 2V and at least one low voltage power line 2G, and also across at least a plurality of the second power lines 5, which comprise at least one high voltage power line 5V and at least one low voltage power line 5G. For example, as shown in FIG. 11, the oblique angle of the power terminal patterns 32 with reference to the first direction may be 45 degrees.

The high and low voltage supply lines 5V and 5G are alternately aligned in the second direction at a constant pitch which is larger than the pitch of the first power lines 2 of the functional macro 1. The oblique direction, along which the power terminal patterns 32 extend, is so decided that each power terminal pattern 32 underlies across at least a plurality of the second power lines 5, which comprise at least one high voltage power line 5V and at least one low voltage power line 5G. For example, as shown in FIG. 12, each straight-shaped power terminal pattern 32 underlies across at least adjacent high and low voltage power lines 5V and 5G. Thus, all of the high and low voltage power lines 5V and 5G overly the power terminal patterns 32.

The power terminal patterns 32 are connected to the respective power lines with contact plugs as in the first embodiment.

Further, overlapping regions between the straight-shaped power terminal patterns 32V and the first voltage power lines 2V are distributed in matrix array over the functional macro. 1. Other overlapping regions between the straight-shaped power terminal patterns 32V and the second voltage power lines 5V are also distributed in matrix array over the functional macro. 1. This structure reduces the voltage drop appearing on the first power lines 2.

The novel structure of this embodiment may provide substantially the same effects and advantages as in the first embodiment.

Figure 13:
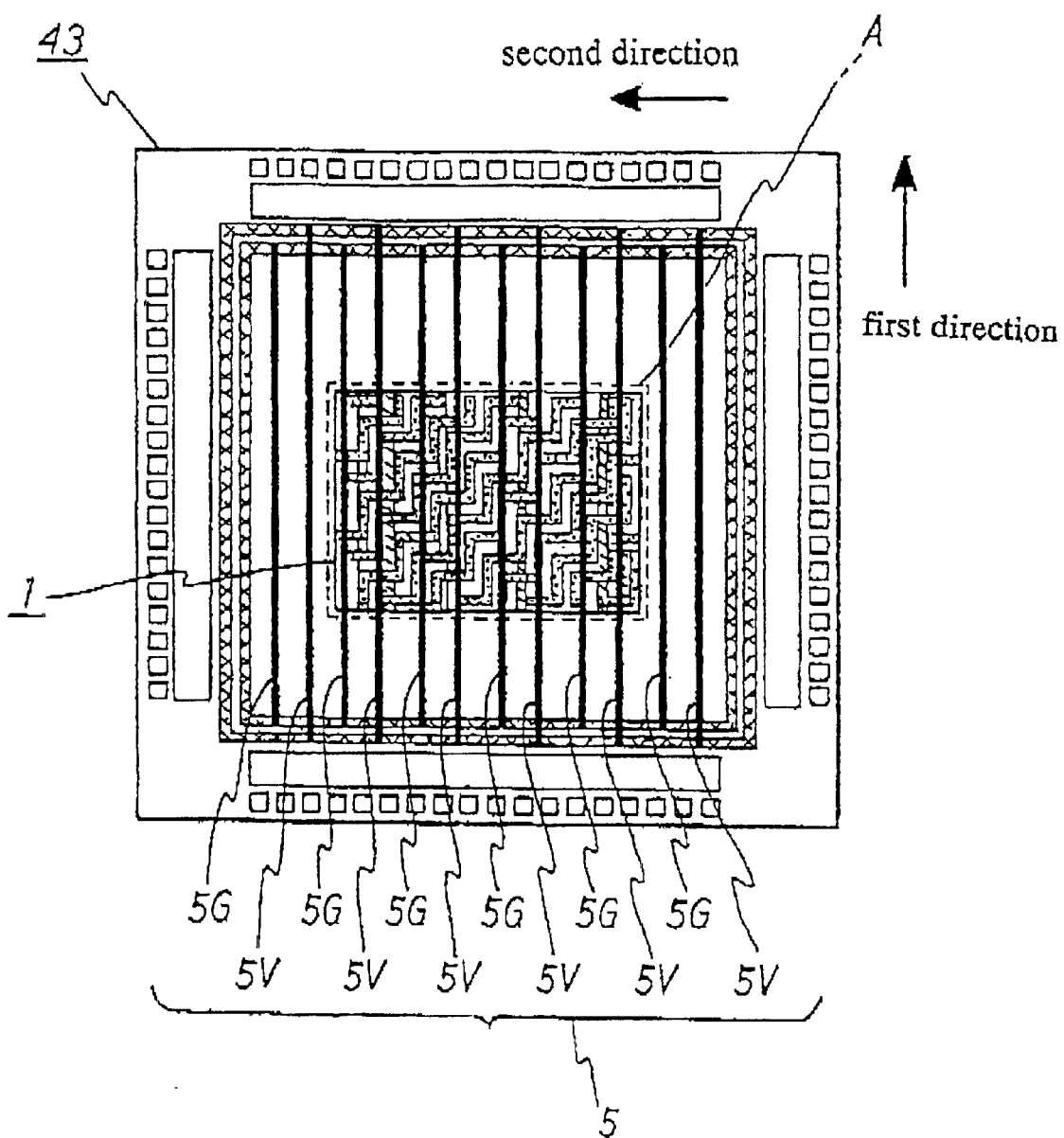
FIG. 13 is a plan view of a semiconductor integrated circuit having a functional macro in a third embodiment in accordance with the present invention.
Figure 15:
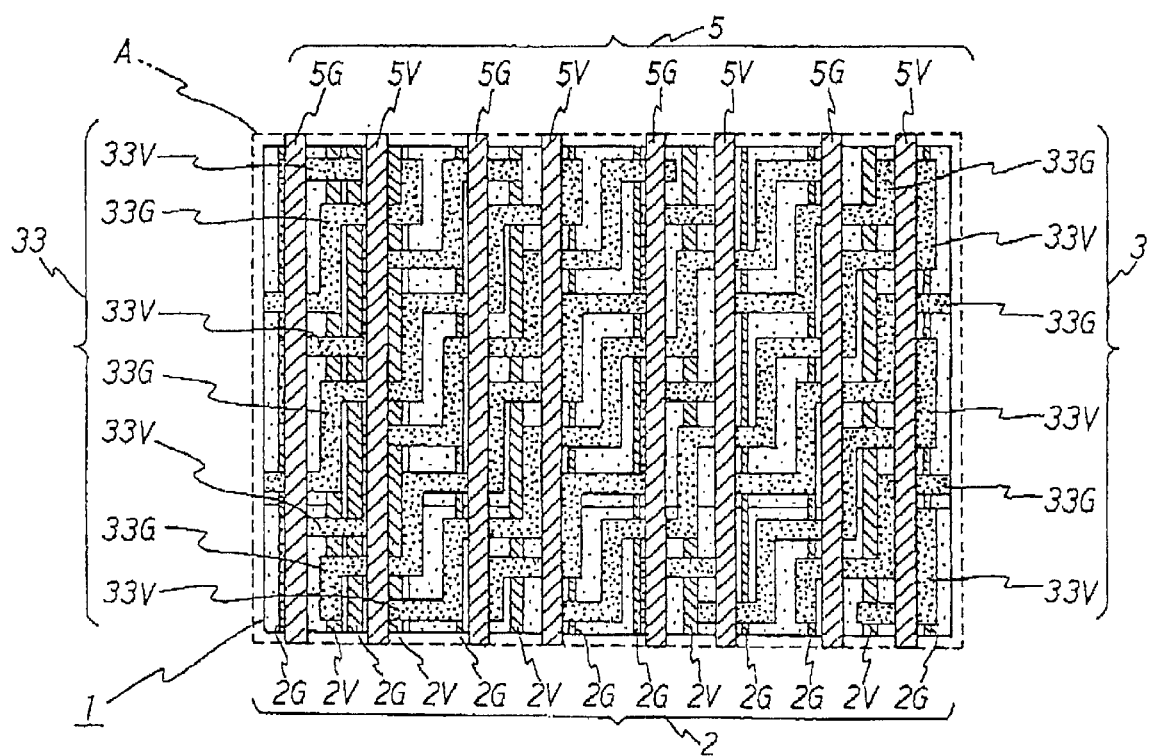
FIG. 15 is a fragmentary enlarged plan view of the semiconductor integrated circuit on a center region "A" shown in FIG. 13.

A third embodiment according to the present invention will be described in detail with reference to FIGS. 13–15. A semiconductor integrated circuit 43 has the same structure as that of the first and second embodiments, except that the functional macro 1 has a zigzag-modified diagonal parallel alignment of power terminal patterns 33, which are provided over a top surface of the first level insulating film. The power terminal patterns 33 have a zigzag-stripe shape with a uniform width and extend in zigzag-shape both in the first and second directions, so that the power terminal patterns 33 extend entirely and generally along a first diagonal direction, which is oblique to the first and second directions. The first and second power lines 2 and 5 extend in the first direction. The first and second power lines 2 and 5 are aligned in the second direction. The above zigzag-modified diagonal parallel alignment has a constant pitch which is different from the first pitch of the first power lines 2 and also from the second pitch of the second power lines 5.

The zigzag-size of the zigzag-shaped stripe of the power terminal patterns 33 is so decided that the above zigzag-modified diagonal direction of the power terminal patterns 33 has such an oblique angle to the first direction that at least a majority of the zigzag-shaped power terminal patterns 33 extends across at least a plurality of the first power lines 2, which comprise at least one high voltage power line 2V and at least one low voltage power line 2G, and also across at least a plurality of the second power lines 5, which comprise at least one high voltage power line 5V and at least one low voltage power line 5G. For example, as shown in FIG. 14, the oblique angle of the zigzag-shaped power terminal patterns 33 with reference to the first direction may be 45 degrees.

The novel structure of this embodiment may provide substantially the same effects and advantages as in the first and second embodiments.

Although the invention has been described above in connection with several preferred embodiments therefor, it will be appreciated that those embodiments have been provided solely for illustrating the invention, and not in a limiting sense. Numerous modifications and substitutions of equivalent materials and techniques will be readily apparent to those skilled in the art after reading the present application, and all such modifications and substitutions are expressly understood to fall within the true scope and spirit of the appended claims.

What is claimed is:

1. A power line connection structure for connecting a semiconductor integrated circuit (IC) to a functional macro, the structure comprising:

plural first power lines on a first level that provide a first voltage to the functional macro and plural second power lines on the first level that provide a second voltage, different than the first voltage, to the functional macro, said first and second power lines being parallel to each other;

plural third power lines on a second level, different than the first level, that provide the first voltage to the IC and plural fourth power lines on the second level that provide the second voltage to the IC, said third and fourth power lines being parallel to each other, and also parallel to said first and second power lines; and plural power terminal patterns on a third level between the first and second levels, said plural power terminal patterns being oblique to said first, second, third and fourth power lines, each of said plural power terminal patterns extending on the third level between a first area corresponding to an adjacent pair of said first and second power lines and a second area corresponding to an adjacent pair of said third and fourth lines so that each of said plural power terminal patterns transverses said first, second, third and fourth power lines, a first set of said plural power terminal patterns being connected to said first and third power lines and second set of said plural power terminal patterns, which does not include any of said first set, being connected to said second and fourth power lines.

2. The structure of claim 1, wherein each of said plural power terminal patterns has the same shape and size.

3. The structure of claim 1, wherein said plural power terminal patterns comprise a repeating pattern of similar shapes that are spaced the same distance from each other.

4. The structure of claim 1, wherein each of said plural power terminal patterns is at an angle of about 45° to said first, second, third and fourth power lines.

5. The structure of claim 1, wherein each of said plural power terminal patterns is a stripe that is at an angle of about 45° to the parallel alignments of both said first and second power lines and said third and fourth power lines.

6. The structure of claim 1, wherein each of said plural power terminal patterns is a zigzag that has an axis that is at an angle of about 45° to the parallel alignments of both said first and second power lines and said third and fourth power lines.

7. The structure of claim 1, further comprising, a first insulator that separate the first level from the third level and a second insulator that separates the third level from the second level, and contact plugs that extend in respective ones of said first and second insulators to connect said first power lines to said third power lines and said second power lines to said fourth power lines.

8. A power line connection structure for connecting a semiconductor integrated circuit (IC) to a functional macro, the structure including:

plural first power lines on a first level that provide a first voltage to the functional macro and plural second power lines on the first level that provide a second voltage, different than the first voltage, to the functional macro, said first and second power lines being parallel to each other;

plural third power lines on a second level, different than the first level, that provide the first voltage to the IC and plural fourth power lines on the second level that provide the second voltage to the IC, said third and fourth power lines being parallel to each other, and also parallel to said first and second power lines; and plural power terminal patterns on a third level between the first and second levels, said plural power terminal patterns being oblique to said first, second, third and fourth power lines, each of said plural power terminal patterns having the same shape and size, wherein a first set of said plural power terminal patterns are connected to said first and third power lines and a second set of said plural power terminal patterns, which does not include any of said first set, are connected to said second and fourth power lines.

9. The structure of claim 8, wherein said plural power terminal patterns comprise a repeating pattern of shapes having the same shape and size that are spaced the same distance from each other.

10. The structure of claim 8, wherein each of said plural power terminal patterns is at an angle of about 45° to said first, second, third and fourth power lines.

11. The structure of claim 8, wherein each of said plural power terminal patterns is a stripe that is at an angle of about 45° to the parallel alignments of both said first and second power lines and said third and fourth power lines.

12. The structure of claim 8, wherein each of said plural power terminal patterns is a zigzag that has an axis that is at an angle of about 45° to the parallel alignments of both said first and second power lines and said third and fourth power lines.

13. The structure of claim 8, further comprising, a first insulator that separate the first level from the third level and a second insulator that separates the third level from the second level, and contact plugs that extend in respective ones of said first and second insulators to connect said first power lines to said third power lines and said second power lines to said fourth power lines.

14. A power line connection structure for connecting a semiconductor integrated circuit (IC) to a functional macro, the structure including:

plural first power lines on a first level that provide a first voltage to the functional macro and plural second power lines on the first level that provide a second voltage, different than the first voltage, to the functional macro, said first and second power lines being parallel to each other;

plural third power lines on a second level, different than the first level, that provide the first voltage to the IC and plural fourth power lines on the second level that provide the second voltage to the IC, said third and fourth power lines being parallel to each other, and also parallel to said first and second power lines; and plural power terminal patterns on a third level between the first and second levels, said plural power terminal patterns being oblique to said first, second, third and fourth power lines, said plural power terminal patterns comprising a repeating pattern of similar shapes that are spaced at the same distance from each other, wherein a first set of said plural power terminal patterns are connected to said first and third power lines and a second set of said plural power terminal patterns, which does not include any of said first set, are connected to said second and fourth power lines.

15. The structure of claim 14, wherein each of said plural power terminal patterns has the same size.

16. The structure of claim 14, wherein each of said plural power terminal patterns is at an angle of about 45° to said first, second, third and fourth power lines.

17. The structure of claim 14, wherein each of said plural power terminal patterns is a stripe that is at an angle of about 45° to the parallel alignments of both said first and second power lines and said third and fourth power lines.

18. The structure of claim 14, wherein each of said plural power terminal patterns is a zigzag that has an axis that is at an angle of about 45° to the parallel alignments of both said first and second power lines and said third and fourth power lines.

19. The structure of claim 14, further comprising, a first insulator that separate the first level from the third level and a second insulator that separates the third level from the second level, and contact plugs that extend in respective ones of said first and second insulators to connect said first power lines to said third power lines and said second power lines to said fourth power lines.

* * * * *